United States Patent
Mitsumochi et al.

(10) Patent No.: US 7,841,073 B2
(45) Date of Patent: Nov. 30, 2010

(54) ELECTRONIC COMPONENT MOUNTING APPARATUS

(75) Inventors: Yutaka Mitsumochi, Saitama (JP); Yoshihiro Onoguchi, Gunma (JP); Masami Iizuka, Ibaraki (JP); Hiroomi Kobayashi, Gunma (JP); Kazuyoshi Oyama, Tochigi (JP); Hisayoshi Kashitani, Gunma (JP); Koichi Izuhara, Gunma (JP)

(73) Assignee: Hitachi High-Tech Instruments Co., Ltd., Kumagaya-shi (JP)

( * ) Notice: Subject to any disclaimer, the term of this patent is extended or adjusted under 35 U.S.C. 154(b) by 146 days.

(21) Appl. No.: 12/109,647

(22) Filed: Apr. 25, 2008

(65) Prior Publication Data

US 2008/0263857 A1    Oct. 30, 2008

(30) Foreign Application Priority Data

Apr. 26, 2007    (JP) .............................. 2007-117763

(51) Int. Cl.
*B23P 19/00*    (2006.01)
(52) U.S. Cl. .............................. 29/743; 29/739; 29/740; 414/409; 414/737; 414/749.1; 414/752.1; 198/428; 198/470.1; 198/471.1; 198/468.4
(58) Field of Classification Search .................. 29/740, 29/743, 834, 833, 739; 414/737, 409, 749.1, 414/752.1, 225; 294/64.2; 198/428, 470.1, 198/471.1, 468.4
See application file for complete search history.

(56) References Cited

U.S. PATENT DOCUMENTS

| | | | | |
|---|---|---|---|---|
| 7,581,310 B2 * | 9/2009 | Fukushima et al. | ........... | 29/743 |
| 2003/0135991 A1 * | 7/2003 | Nagao et al. | ........... | 29/739 |
| 2005/0274004 A1 * | 12/2005 | Yoshii et al. | ........... | 29/743 |
| 2007/0011869 A1 * | 1/2007 | Watanabe et al. | ........... | 29/739 |

FOREIGN PATENT DOCUMENTS

JP        2006-286707        10/2006

* cited by examiner

*Primary Examiner*—Derris H Banks
*Assistant Examiner*—Azm Parvez
(74) *Attorney, Agent, or Firm*—Morrison & Foerster LLP

(57) ABSTRACT

The invention is directed to an electronic component mounting apparatus which is applicable to a case in which component feeding devices need not be provided on both sides of a carrying device respectively for reasons of types of electronic components or a setting space and increases an operating rate of a beam to enhance production efficiency. An electronic component mounting apparatus has a carrying device carrying a printed board, a component feeding device supplying electronic components, a pair of beams movable in one direction by drive sources, and mounting heads each having suction nozzles and movable along the beams by drive sources. The component feeding device is provided on only one side of the carrying device, and the suction nozzles provided on each of the mounting heads pick up electronic components from the component feeding device and mount the electronic components on a printed board by moving the mounting heads provided on both the beams between the printed board on the carrying device and the component feeding device by driving the drive sources respectively.

2 Claims, 11 Drawing Sheets

ELECTRONIC COMPONENT MOUNTING APPARATUS

CROSS-REFERENCE OF THE INVENTION

This application claims priority from Japanese Patent Application No. 2007-117763, the content of which is incorporated herein by reference in its entirety.

BACKGROUND OF THE INVENTION

1. Field of the Invention

The invention relates to an electronic component mounting apparatus for picking up electronic components from a component feeding device by suction by suction nozzles and mounting the electronic components on a positioned printed board. In detail, the invention relates to an electronic component mounting apparatus having a carrying device carrying a printed board, a component feeding device supplying electronic components, a pair of beams movable in one direction by drive sources, mounting heads each having suction nozzles and movable along the beams by drive sources respectively.

2. Description of the Related Art

This type of electronic component mounting apparatus is disclosed in, for example, Japanese Patent Application publication No. 2006-286707 and so on. In general, component feeding devices supplying electronic components are respectively provided on both sides of a carrying device carrying a printed board, and a pair of beams each having a mounting head are provided for the component feeding devices respectively. It means that each of the beams corresponds to each of the component feeding devices and the mounting head of one beam picks up electronic components from the corresponding component feeding device only and mounts the electronic components on a printed board.

In some cases, however, component feeding devices need not be provided on both sides of a carrying device respectively for reasons of types of electronic components or a setting space. Furthermore, when component feeding devices are respectively provided on both sides of a carrying device, particularly in a case of using a tray feeder as one of the component feeding devices which has electronic components on trays so as to be picked up by suction nozzles, if the frequency of picking up the electronic components from this tray feeder is low, the operating rate of a corresponding beam is decreased and production efficiency is degraded.

The invention is directed to an electronic component mounting apparatus which increases the operating rate of the beam to enhance the production efficiency. The invention is also directed to an electronic component mounting apparatus which is applicable to the case in which the component feeding device is provided on one side of the carrying device as well as the case in which the component feeding device are provided on both sides of the carrying device respectively for reasons of types of electronic components or a setting space.

SUMMARY OF THE INVENTION

The invention provides an electronic component mounting apparatus including: a carrying device carrying a printed board; a component feeding device supplying an electronic component; a pair of beams movable in one direction by beam drive sources respectively; and mounting heads each having a suction nozzle and movable along the beams by mounting head drive sources respectively, wherein the component feeding device is provided on only one side of the carrying device, and the suction nozzle provided on each of the mounting heads picks up an electronic component from the component feeding device and mounts the electronic component on a printed board by moving each of the mounting heads provided on the beams between the printed board on the carrying device and the component feeding device by driving each of the drive sources.

The invention also provides an electronic component mounting apparatus including: a carrying device carrying a printed board; component feeding devices supplying an electronic component and provided on both sides of the carrying device respectively; a pair of beams movable in one direction by beam drive sources respectively; and mounting heads each having a suction nozzle and movable along the beams by mounting head drive sources respectively, wherein the suction nozzle of the mounting head provided on each of the beams picks up an electronic component from either of the component feeding devices by driving the drive sources respectively.

DETAILED DESCRIPTION OF THE INVENTION

Figure 1:
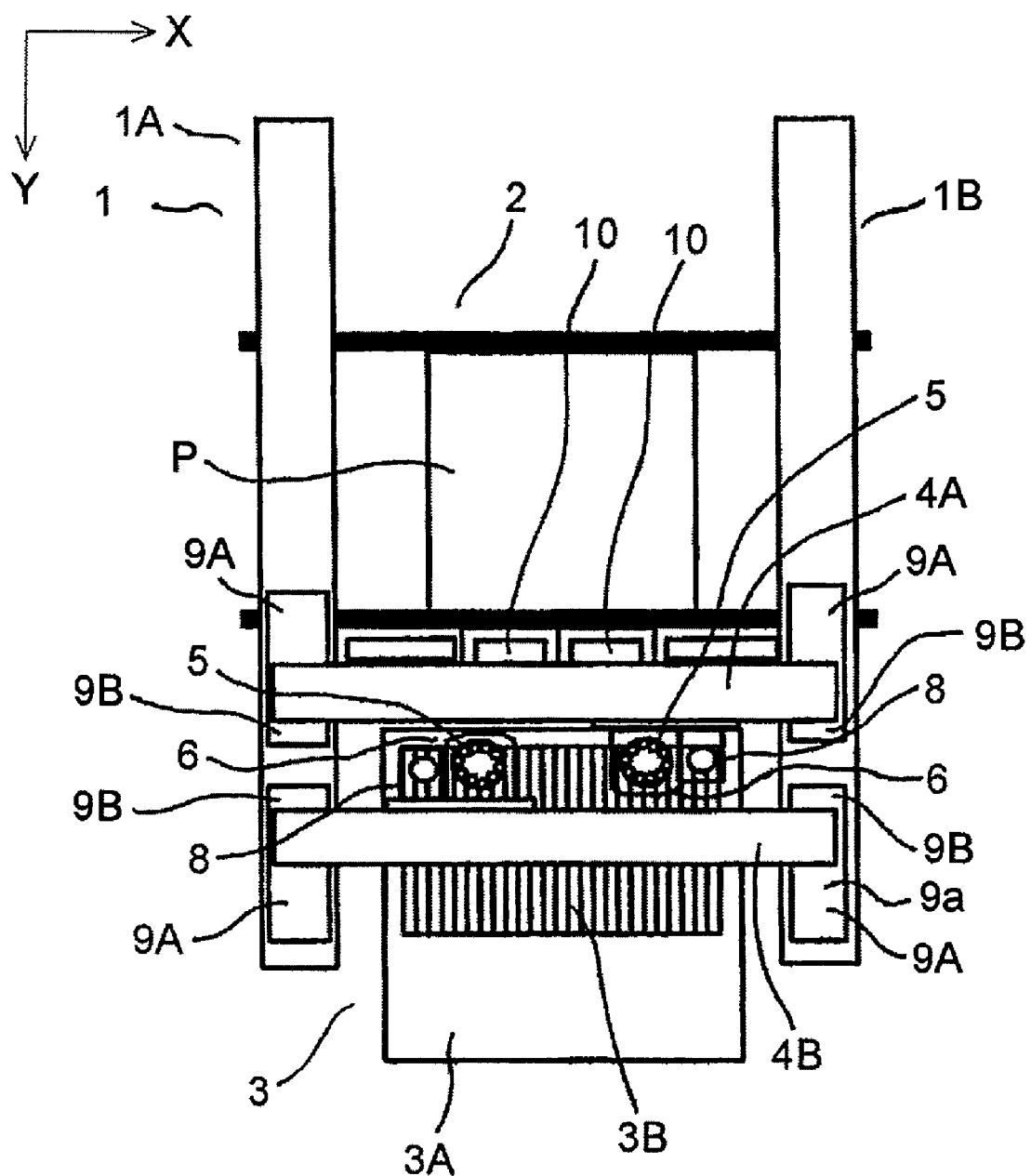
FIGS. 1 and 2 are schematic plan views for explaining an electronic component pickup operation of an electronic component mounting apparatus of a first embodiment of the invention.

Hereafter, a first embodiment of an electronic component mounting apparatus for mounting electronic components on a printed board will be described referring to FIGS. 1 to 4. An electronic component mounting apparatus 1 is provided with a carrying device 2 carrying a printed board P, a component feeding device 3 supplying electronic components, a pair of beams 4A and 4B movable in one direction by drive sources, and mounting heads 6 each having suction nozzles 5 and movable along the beams 4A and 4B by drive sources respectively.

The carrying device 2 is disposed in the middle portion of the electronic component mounting apparatus 1, and has a board supply portion receiving a printed board P from an upstream device, a positioning portion positioning the printed board P supplied from the board supply portion for mounting electronic components held by suction by the suction nozzles 5 of the mounting heads 6, and a discharging portion receiving the printed board P on which the electronic components are mounted at the positioning portion and discharging it to a downstream device. In the embodiment shown in FIG. 1, for example, the board supply portion is located at the left end of the carrying device 2 and the discharging portion is located at the right end of the carrying device 2. In other words, the printed board P is transported from left to right in the X direction.

The component feeding device 3 is disposed on one side of the carrying device 2, for example, on the front side of the carrying device 2, and has a feeder base 3A mounted on the body of the electronic component mounting apparatus 1 and a group of component feeding units 3B arrayed on this feeder base 3A and supplying various electronic components to those component pickup portions (component suction positions) one by one.

A pair of front and rear beams 4A and 4B extending in the X direction are moved in the Y direction separately by sliders fixed to each of the beams sliding along a pair of left and right guides extending in the front to rear direction, driven by each of Y direction linear motors. Each of the Y direction linear motors has a pair of upper and lower stationary members fixed to a pair of left and right bases 1A and 1B therealong, and moving members 9a fixed to lower portions of attachment boards respectively provided on both the ends of each of the beams 4A and 4B. Each of the moving members 9a includes a moving member 9A on the outside of the beams 4A and 4B and a moving member 9B on the inside thereof, and the length of the moving member 9B in the moving direction is shorter than the length of the moving member 9A in the moving direction. This enables the beams 4A and 4B to approach each other without the necessity of forming the mounting heads 6 of the beams 4A and 4B long in the Y direction, and realizes simultaneous component pickup operations by the mounting heads 6 provided on the beams 4A and 4B respectively. Although mounting heads 6 which are longer in the Y direction require a longer distance between the beams 4A and 4B and provide a larger electronic component mounting apparatus to cause a problem in the space, the above structure reduces the distance and saves the space.

The mounting heads 6 which move along guides in the longitudinal direction (the X direction) of the beams 4A and 4B by X direction linear motors are provided on the beams 4A and 4B on the inside respectively, and each of the X direction linear motors has a pair of front and rear stationary members fixed to each of the beams 4A and 4B and a moving member located between the stationary members which is provided on each of the mounting heads 6.

Therefore, the mounting heads 6 are provided on the beams 4A and 4B on the inside so as to face each other, and move above a printed board P on the positioning portion of the carrying device 2 or above the component pickup positions of the component feeding units 3B.

The twelve suction nozzles 5 are provided on each of the mounting heads 6 at predetermined intervals in a circle, being pushed downward by springs, and the suction nozzles 5 in the 3 o'clock and 9 o'clock positions of each of the mounting heads 6 may pick up electronic components simultaneously from the arrayed component feeding units 3B. The suction nozzles 5 are vertically movable by a vertical axis motor and movable in the X and Y directions by rotating the mounting head 6 about a vertical axis by a θ axis motor, having a capability of rotating about a vertical axis and moving vertically.

A board recognition camera 8 is provided on each of the mounting heads 6, which takes an image of a positioning mark given to a positioned printed board P. Component recognition cameras 10 sequentially take images of electronic components picked up by suction by the suction nozzles 5.

An operation with the above structure will be described, hereafter. First, a printed board P is received from the upstream device (not shown) and supplied onto the supply portion of the carrying device 2, and the printed board P on the supply portion is moved to the positioning portion, positioned, and fixed.

Once the printed board P is positioned, the beam 4B on the front side moves in the Y direction by the sliders sliding along the guides extending in the front to rear direction, driven by the Y direction linear motor, and the mounting head 6 moves in the X direction by the X direction linear motor, reaches the position above the component pickup position of the component feeding unit 3B, and lowers the suction nozzle 5 by the vertical axis motor to pick up an electronic component from the component feeding unit 3. At this time, by moving the mounting head 6 in the X direction and rotating the mounting head 6 and by vertically moving each of the suction nozzles 5, the plurality of suction nozzles 5 achieve picking up the electronic components from the component feeding units 3B respectively.

Furthermore, after the suction nozzles 5 of the mounting head 6 on the front side pick up the electronic components or during this picking, the beam 4A on the rear side moves in the Y direction by the Y direction linear motor, and simultaneously the mounting head 6 moves in the X direction by the X direction linear motor, reaches the position above the component pickup position of the component feeding unit 3B, lowers the suction nozzle 5 by the vertical axis motor, and picks up an electronic component from the component feeding unit 3. In a case of performing simultaneous pickup operations by the suction nozzles 5 of the beam 4B on the front side and the suction nozzles 5 of the beam 4A on the rear side, the corresponding Y direction linear motors and the corresponding X direction linear motors are controlled so that the mounting heads 6 of both the beams 4B and 4A do not hit against each other (FIG. 1).

Figure 2:
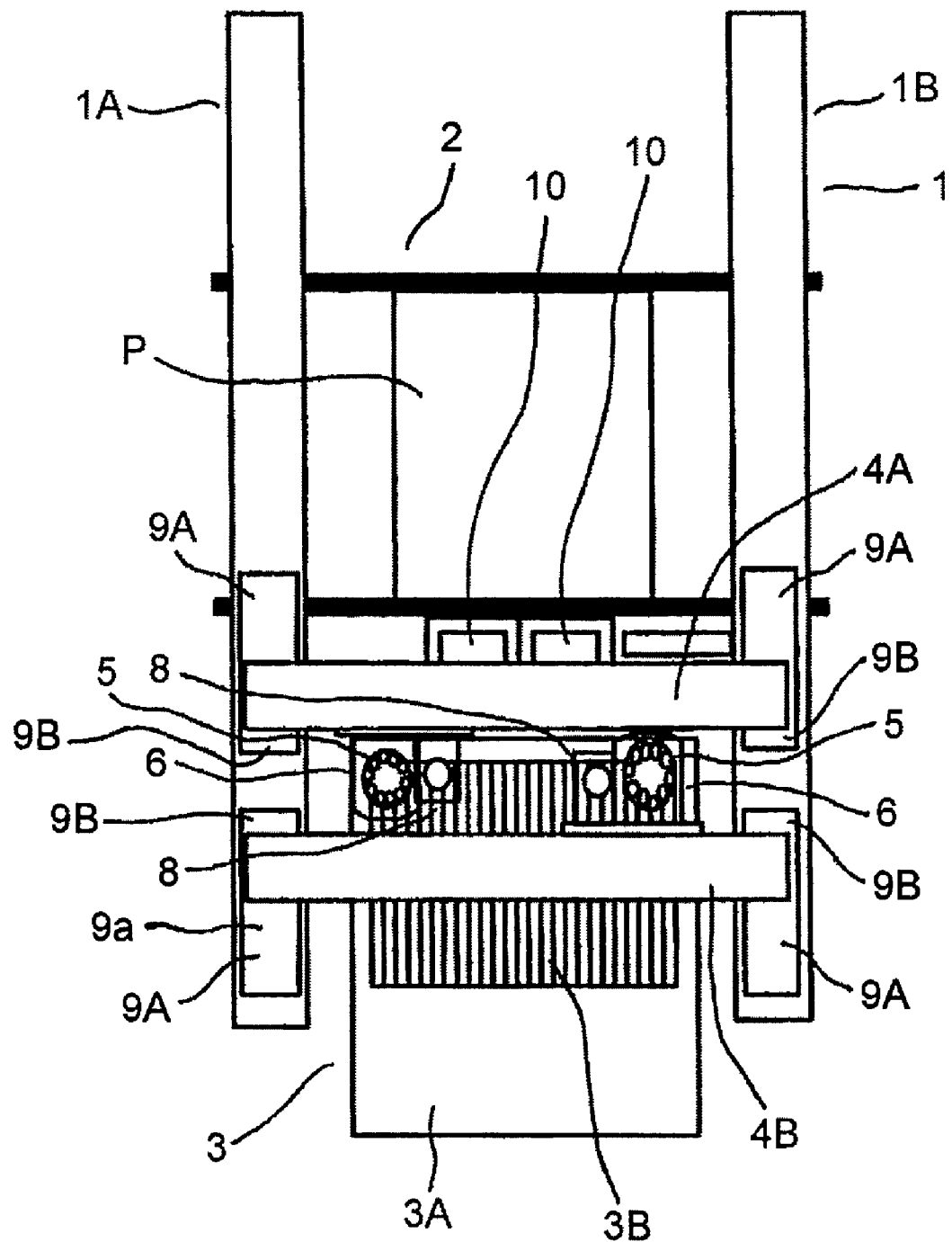

Furthermore, the apparatus realizes not only the operation in which the mounting head 6 of the beam 4B on the front side picks up electronic components from the component feeding units 3B in the left half portion of the component feeding device 3 and the mounting head 6 of the beam 4A on the rear side picks up electronic components from the component feeding units 3B in the right half portion of the component feeding device 3 (FIG. 1), but also the operation in which the mounting head 6 of the beam 4B on the front side picks up electronic components from the component feeding units 3B in the right half portion of the component feeding device 3 and the mounting head 6 of the beam 4A on the rear side picks up electronic components from the component feeding units 3B in the left half portion of the component feeding device 3 by moving the beam 4A and/or the beam 4B in the Y direction apart from each other to positions where both the mounting heads 6 do not hit against each other, then moving both the mounting heads 6 in the X direction, and moving the beam 4A and/or the beam 4B in the Y direction close to each other (FIG. 2).

It means that both the beams 4B and 4A are controlled so as not to come too close in the Y direction and both the mounting heads 6 are controlled so as not to come too close in the X direction, thereby preventing the mounting heads 6 of both the beams 4B and 4A from hitting against each other.

The suction nozzles 5 of both the mounting heads 6 are then moved upward after picking up the electronic components, and the mounting heads 6 of both the beams 4A and 4B pass the component recognition cameras 10 thereabove. During this passing, the component recognition cameras 10 take images of the plurality of electronic components held by suction by the suction nozzles 5 of both the mounting heads 6, and a recognition processing device performs recognition processing to these images to recognize the positional shifts of the electronic components relative to the suction nozzles 5.

Then, the board recognition camera 8 of each of both the beams 4A and 4B is moved to above the printed board P and takes an image of a positioning mark given to a positioned printed board P, and the recognition processing device performs recognition processing to this image to recognize the position of the printed board P. Then, the positional recognition result about the printed board P and each of the component recognition processing results are added to the mounting coordinate of mounting data, and each of the suction nozzles 5 mounts the electronic component on the printed board P after the correction of the positional shift.

Figure 3:
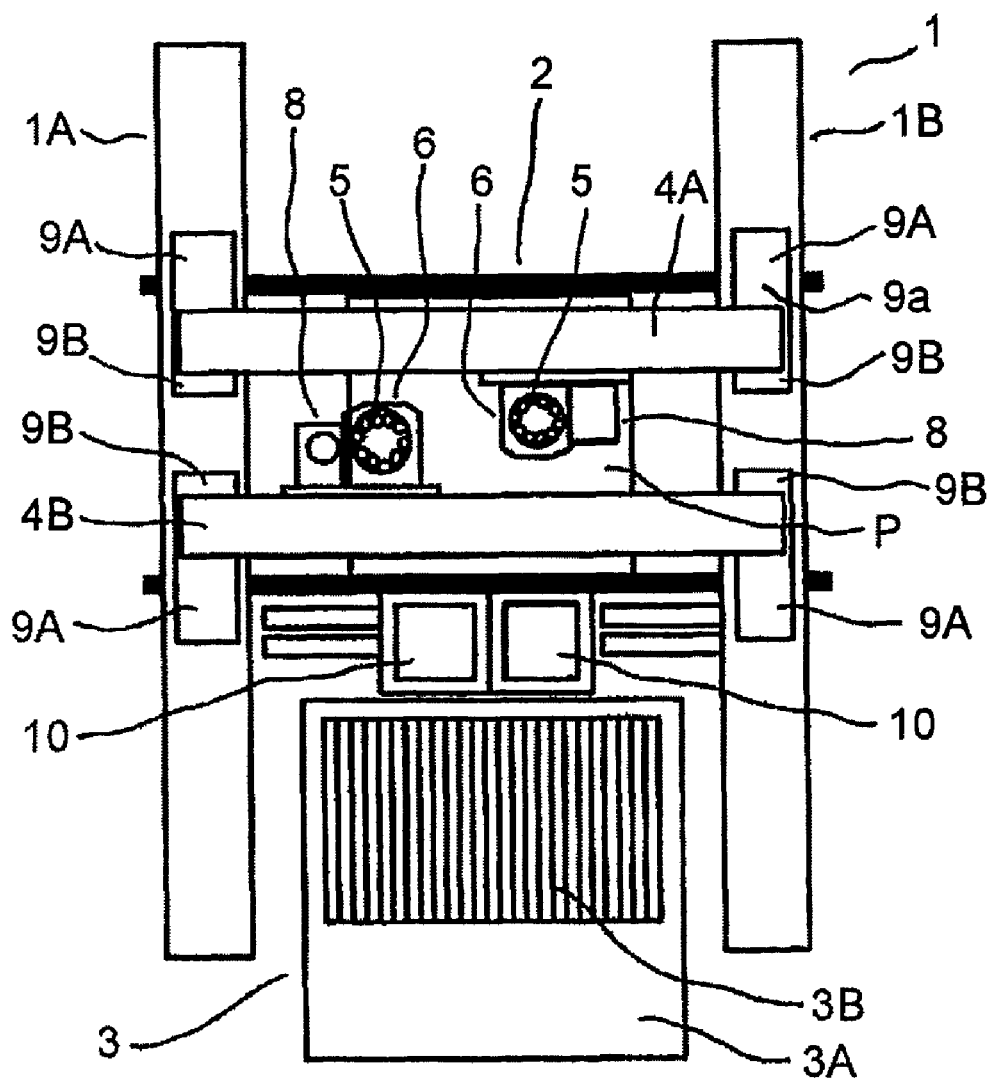
FIGS. 3 and 4 are schematic plan views for explaining an electronic component mounting operation of the electronic component mounting apparatus of the first embodiment of the invention.

At this time, after the suction nozzles 5 of the mounting head 6 of the beam 4A on the rear side mount the electronic components on the printed board P or during this mounting, the suction nozzles 5 of the mounting head 6 of the beam 4B on the front side mount the electronic components on the printed board P. In a case of performing simultaneous mounting operations by the suction nozzles 5 of the beam 4A on the rear side and the suction nozzles 5 of the beam 4B on the front side, the corresponding Y direction linear motors and the corresponding X direction linear motors are controlled so that the mounting heads 6 of both the beams 4A and 4B do not hit against each other (FIG. 3).

Figure 4:
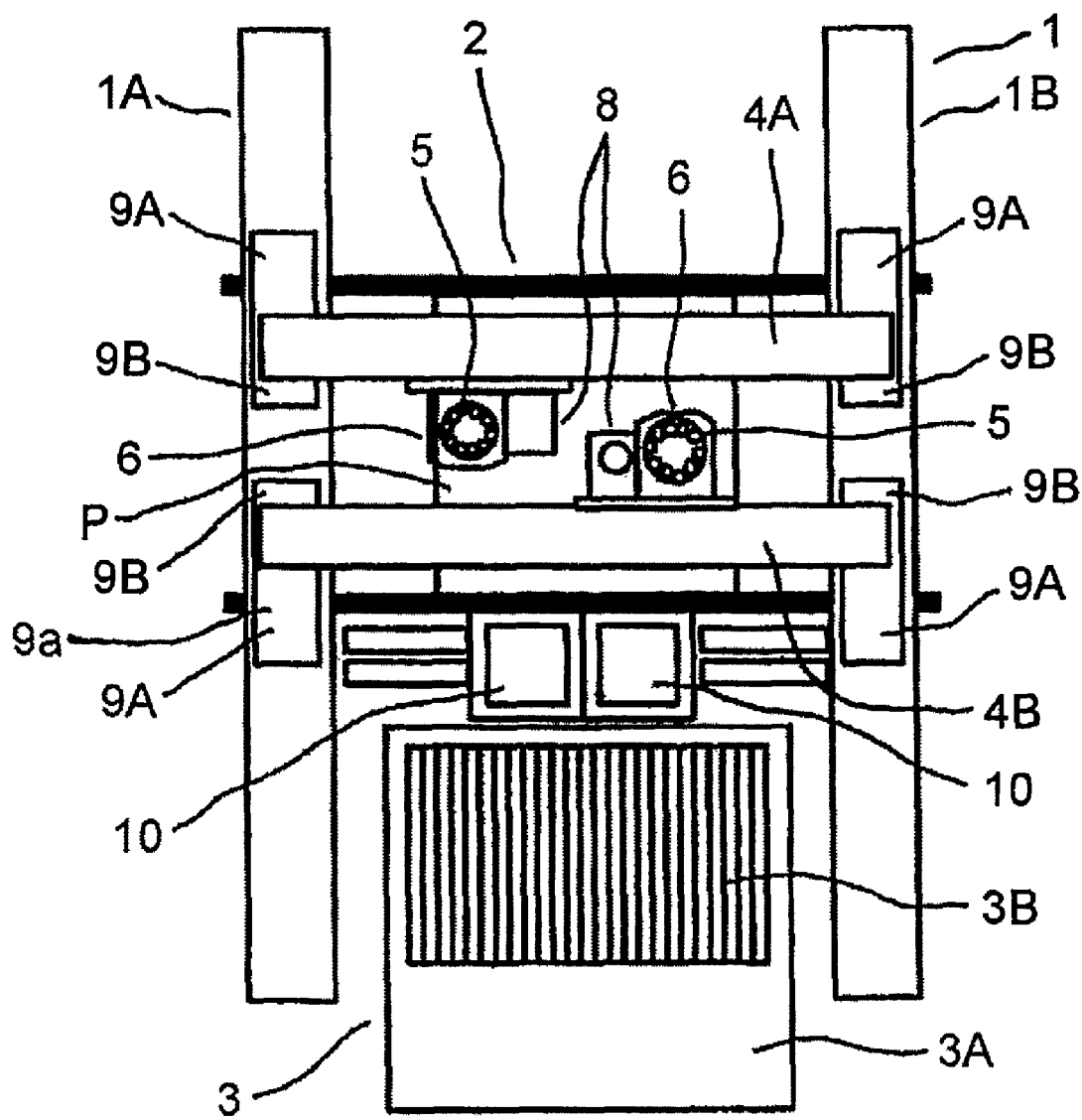

Furthermore, the apparatus realizes not only the operation in which the mounting head 6 of the beam 4B on the front side mounts electronic components on the left half region of the printed board P and the mounting head 6 of the beam 4A on the rear side mounts electronic components on the right half region of the printed board P (FIG. 3), but also the operation in which the mounting head 6 of the beam 4B on the front side mounts electronic components on the right half region of the printed board P and the mounting head 6 of the beam 4A on the rear side mounts electronic components on the left half region of the printed board P by moving the beam 4A and/or the beam 4B in the Y direction apart from each other to positions where both the mounting heads 6 do not hit against each other, then moving both the mounting heads 6 in the X direction, and moving the beam 4A and/or the beam 4B in the Y direction close to each other (FIG. 4).

As described above, from the component feeding device 3 provided on only one side of the carrying device 2, the suction nozzles 5 of the mounting head 6 the beam 4A on the rear side as well as the suction nozzles 5 of the mounting head 6 of the beam 4B on the front side pick up electronic components, and even simultaneously pick up electronic components. Furthermore, the suction nozzles 5 of the mounting head 6 of the beam 4B on the front side and the suction nozzles 5 of the mounting head 6 of the beam 4A on the rear side simultaneously mount electronic components on the printed board P.

Therefore, the invention is applicable to the case in which the component feeding devices 3 need not be provided on both the sides of the carrying device 2 respectively for reasons of types of electronic components used or a setting space. After all the electronic components are mounted on the printed board P by sequentially mounting the electronic components in this manner, the printed board P is carried from the positioning portion to the discharging portion.

Next, a second embodiment will be described referring to FIGS. 5 to 7, but only a structure differing from the first embodiment will be described. While the component feeding device 3 is disposed on only one side of the carrying device 2, for example, on the front side of the carrying device 2 in the first embodiment, the component feeding devices 3 are disposed on both the sides of the carrying device 2 respectively in the second embodiment.

In the second embodiment, the Y direction linear motors and the X direction linear motors corresponding to the beams 4A and 4B respectively are controlled so that the suction nozzles 5 of the mounting heads 6 provided on the beams 4A and 4B pick up electronic components from either of the component feeding devices 3.

Figure 5:
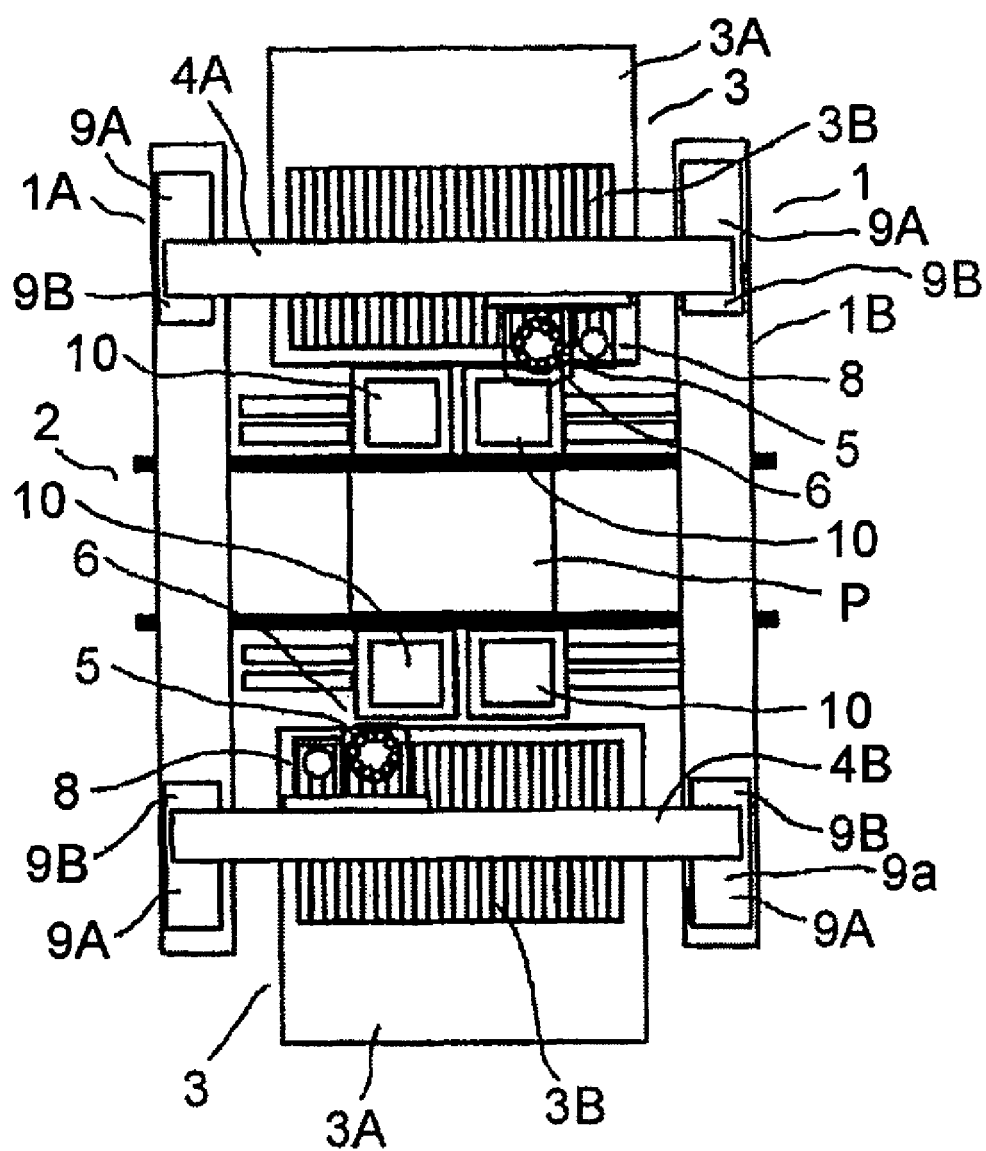
FIGS. 5 and 6 are schematic plan views for explaining an electronic component pickup operation of an electronic component mounting apparatus of a second embodiment of the invention.

In detail, as shown in FIG. 5, the suction nozzles 5 of the mounting head 6 provided on the beam 4A on the rear side pick up electronic components from the component feeding device 3 on the rear side and the suction nozzles 5 of the mounting head 6 provided on the beam 4B on the front side pick up electronic components from the component feeding device 3 on the front side. Furthermore, as shown in FIG. 6, for example, the suction nozzles 5 of the mounting head 6 provided on the beam 4B on the front side pick up electronic components not only from the component feeding device 3 on the front side but also from the component feeding device 3 on the rear side, and similarly the suction nozzles 5 of the mounting head 6 provided on the beam 4A on the rear side pick up electronic components not only from the component feeding device 3 on the rear side but also from the component feeding device 3 on the front side.

Figure 6:
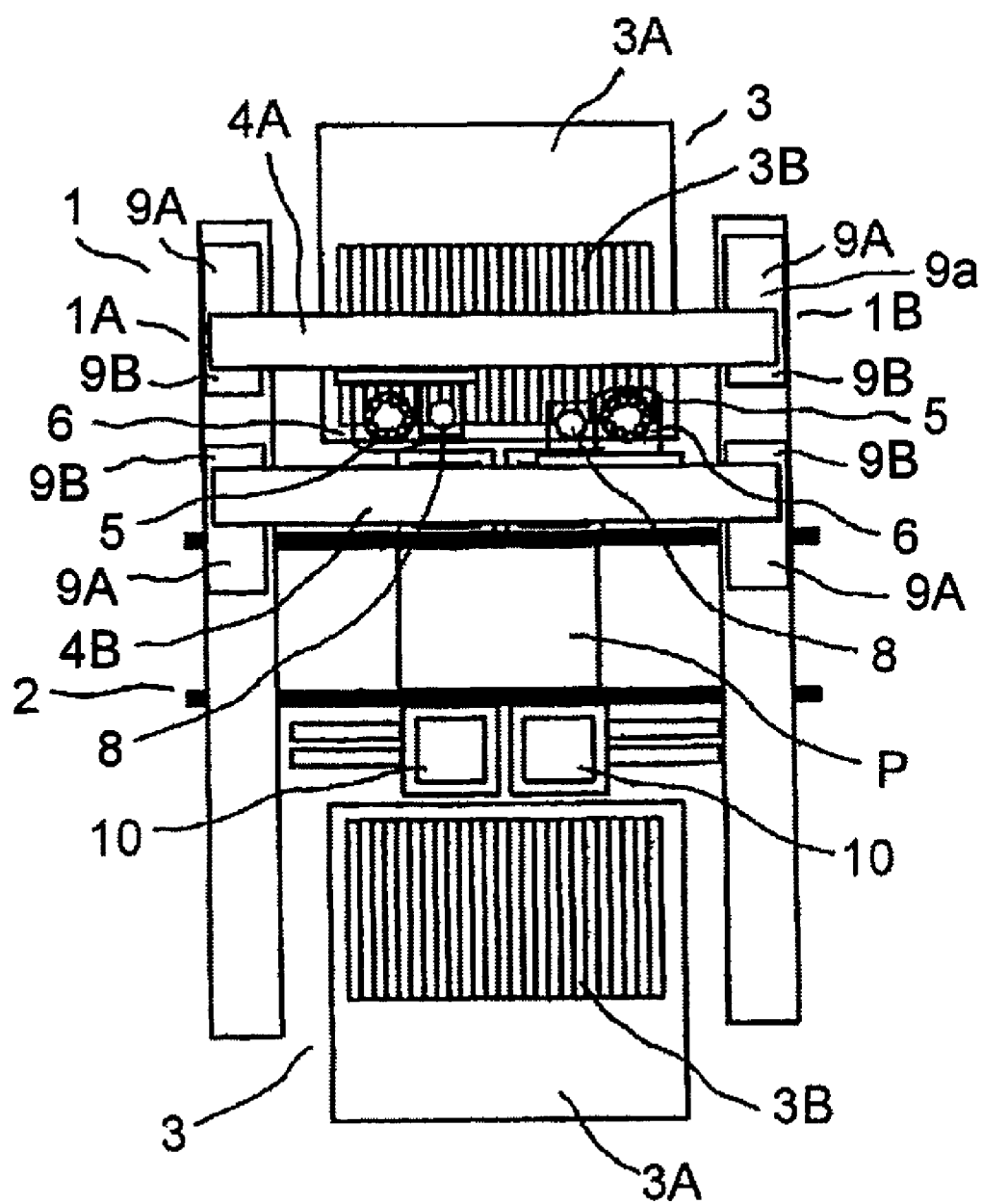

At this time, for example, as shown in FIG. 6, when the suction nozzles 5 of the mounting heads 6 provided on the beam 4B on the front side and the beam 4A on the rear side simultaneously pick up electronic components from the component feeding device 3 on the rear side, the suction nozzles 5 of the mounting heads 6 of both the beams 4A and 4B achieve picking up electronic components from the component feeding units 3B in both the left and right half regions of the component feeding device 3 on the rear side instead of from the left or right half region limitedly, being controlled so as not to hit against each other, by moving both the beams 4A and/or 4B apart from each other and then moving both the mounting heads 6 to the opposite sides, as described above.

Figure 7:
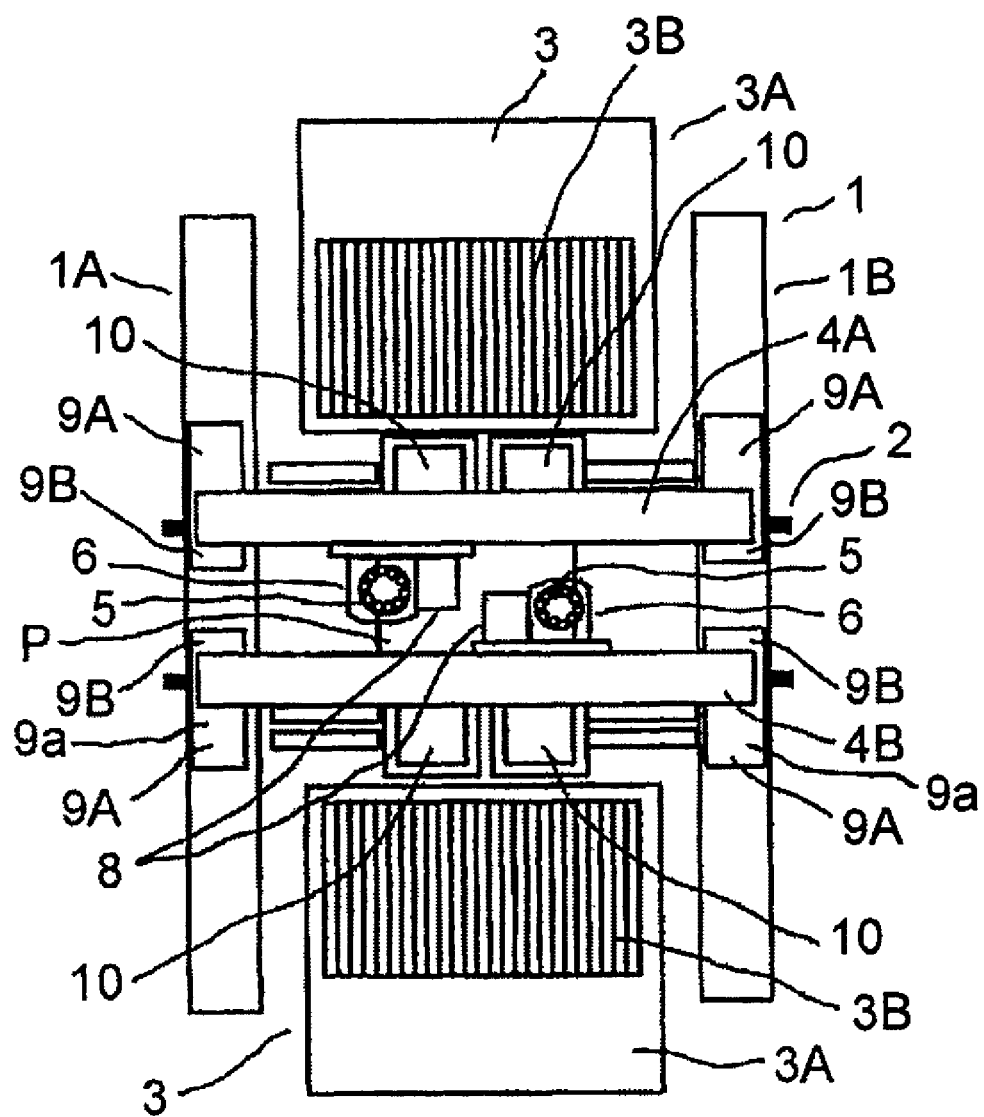
FIG. 7 is a schematic plan view for explaining an electronic component mounting operation of the electronic component mounting apparatus of the second embodiment of the invention.

Furthermore, as shown in FIG. 7, when mounting the electronic components on the printed board P, too, the suction nozzles 5 of the mounting heads 6 of both the beams 4A and 4B achieve mounting the electronic components on all the regions of the printed board P instead of on the left or right half region limitedly, being controlled so as not to hit against each other, by moving both the beams 4A and/or 4B apart from each other and then moving both the mounting heads 6 to the opposite sides, as described above.

Next, a third embodiment will be described referring to FIG. 8, but only a structure differing from the first embodiment will be described. While in the first embodiment the component feeding device 3 is disposed on only one side of the carrying device 2 and electronic components are mounted on one printed board P on the positioning portion of the carrying device 2 by the suction nozzles 5 of the mounting heads 6 of both the beams 4A and 4B, two printed boards P are provided on the carrying device 2 in the third embodiment.

The third embodiment is the same as the first embodiment in that the suction nozzles 5 of the beam 4B on the front side and the suction nozzles 5 of the beam 4A on the rear side pick up electronic components simultaneously and even pick up electronic components from any regions of the component feeding device 3.

Figure 8:
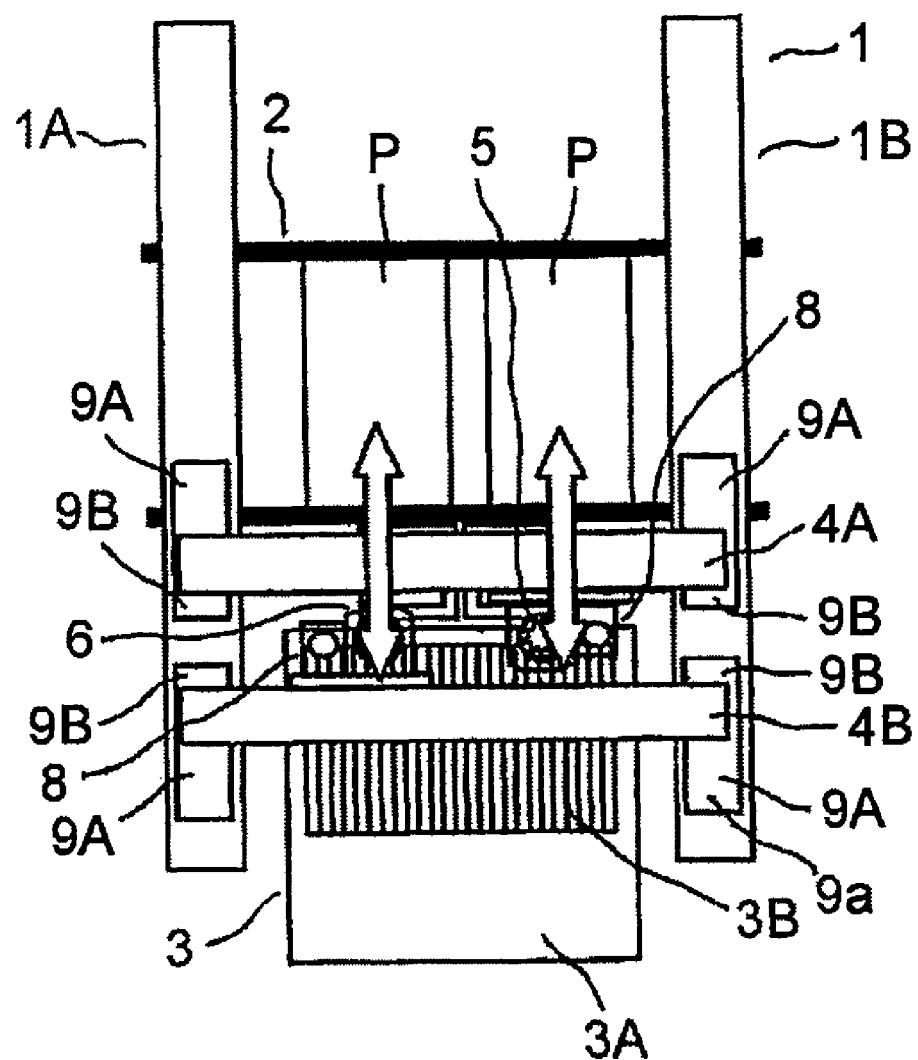
FIG. 8 is a schematic plan view for explaining an electronic component pickup operation of an electronic component mounting apparatus of a third embodiment of the invention.

After picking up the electronic components, as shown in FIG. 8, the suction nozzles 5 of the beam 4B on the front side mount the electronic components on the left printed board P and the suction nozzles 5 of the beam 4A on the rear side mount the electronic components on the right printed board P. At this time, the suction nozzles 5 of both the beams 4B and 4A may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right printed boards P. In both the described cases, the suction nozzles 5 of the mounting heads 6 of both the beams 4A and 4B are controlled so as not to hit against each other.

Next, a fourth embodiment will be described referring to FIG. 9, but only a structure differing from the first embodiment will be described. While in the first embodiment the component feeding device 3 is disposed on only one side of the carrying device 2 and electronic components are mounted on one printed board P on the positioning portion of the carrying device 2 by the suction nozzles 5 of the mounting heads 6 of both the beams 4A and 4B, two printed boards P are provided on each of two carrying devices 2 in the fourth embodiment.

The fourth embodiment is the same as the first embodiment in that the suction nozzles 5 of the beam 4B on the front side and the suction nozzles 5 of the beam 4A on the rear side pick up electronic components simultaneously and even pick up electronic components from any regions of the component feeding device 3.

Figure 9:
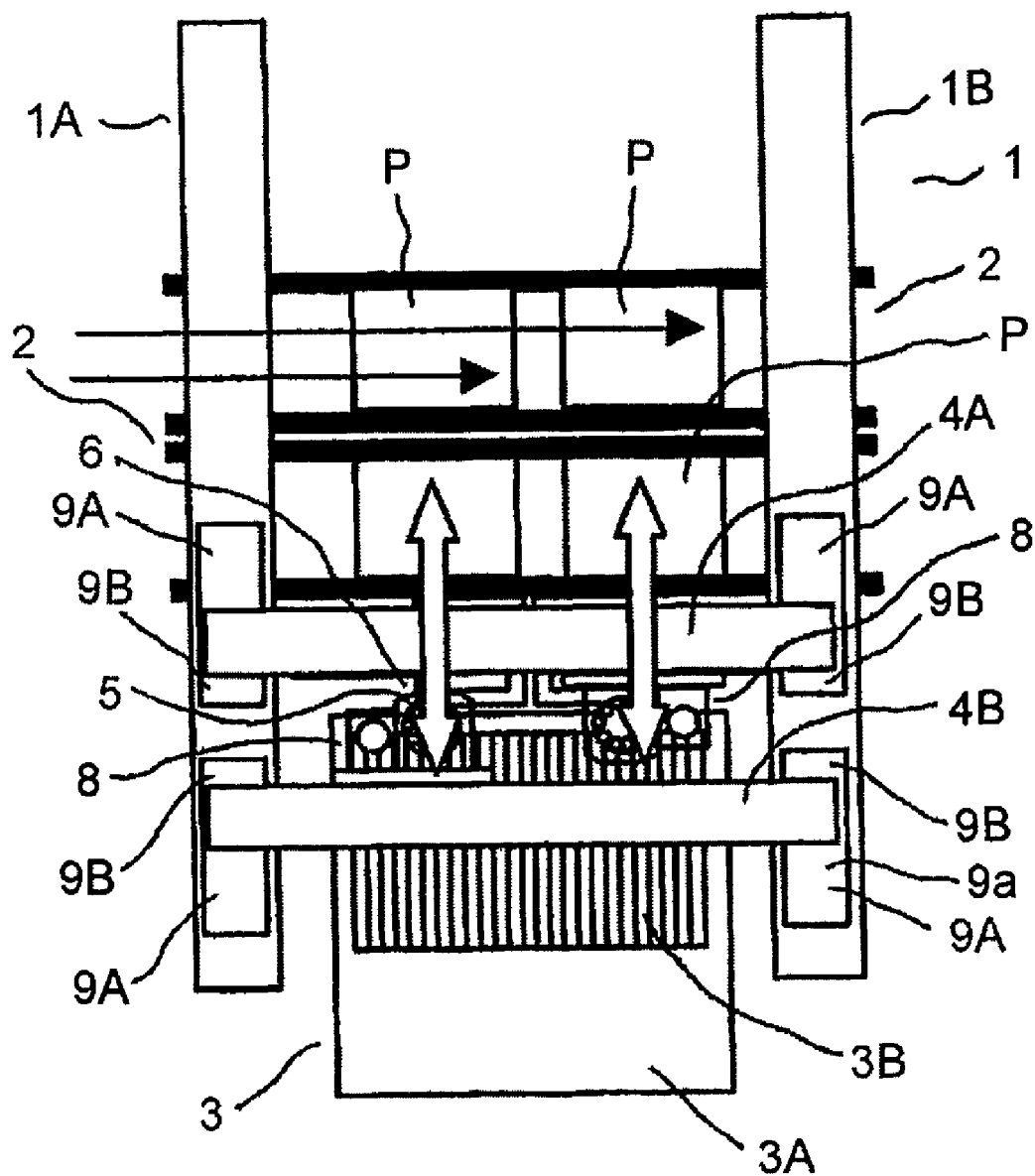
FIG. 9 is a schematic plan view for explaining an electronic component pickup operation of an electronic component mounting apparatus of a fourth embodiment of the invention.

After picking up the electronic components, as shown in FIG. 9, the suction nozzles 5 of the beam 4B on the front side mount the electronic components on the left printed board P on the carrying device 2 on the front side and the suction nozzles 5 of the beam 4A on the rear side mount the electronic components on the right printed board P on the carrying device 2 on the front side. At this time, the suction nozzles 5 of both the beams 4B and 4A may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right printed boards P on the carrying device 2 on the front side. In both the described cases, the suction nozzles 5 of the mounting heads 6 of both the beams 4A and 4B are controlled so as not to hit against each other.

Another two printed boards P are already positioned on the positioning portions of the carrying device 2 on the rear side, respectively. Therefore, after completing the mounting of the electronic components on the two printed boards P on the carrying device 2 on the front side, the suction nozzles 5 of the beam 4B on the front side mount the electronic components on the left printed board P on the carrying device 2 on the rear side and the suction nozzles 5 of the beam 4A on the rear side mount the electronic components on the right printed board P on the carrying device 2 on the rear side. At this time, the suction nozzles 5 of both the beams 4A and 4B may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right printed boards P on the carrying device 2 on the rear side. In both the described cases, the suction nozzles 5 of the mounting heads 6 of both the beams 4A and 4B are controlled so as not to hit against each other.

Although two printed boards P are positioned on each of the carrying devices 2 and electronic components are mounted thereon in the fourth embodiment, the invention is not limited to this. One printed board P may be positioned on each of the carrying devices 2 and electronic components may be mounted thereon.

Next, a fifth embodiment will be described referring to FIG. 10, but only a structure differing from the first embodiment will be described. While in the first embodiment the component feeding device 3 is disposed on only one side of the carrying device 2, for example, on the front side of the carrying device 2, the component feeding devices 3 are disposed on both the sides of the carrying device 2 respectively and two printed boards P are provided on each of two carrying devices 2 in the fifth embodiment.

In the fifth embodiment, the Y direction linear motors and the X direction linear motors corresponding to the beams 4A and 4B respectively are controlled so that the suction nozzles 5 of the mounting heads 6 the beams 4A and 4B pick up electronic components from either of the component feeding devices 3.

In detail, the suction nozzles 5 of the mounting head 6 provided on the beam 4A on the rear side pick up electronic components from the component feeding device 3 on the rear side and the suction nozzles 5 of the mounting head 6 provided on the beam 4B on the front side pick up electronic components from the component feeding device 3 on the front side. Furthermore, as shown in FIG. 10, for example, the suction nozzles 5 of the mounting head 6 provided on the beam 4B on the front side pick up electronic components not only from the component feeding device 3 on the front side but also from the component feeding device 3 on the rear side, and similarly the suction nozzles 5 of the mounting head 6 provided on the beam 4A on the rear side pick up electronic components not only from the component feeding device 3 on the rear side but also from the component feeding device 3 on the front side.

Figure 10:
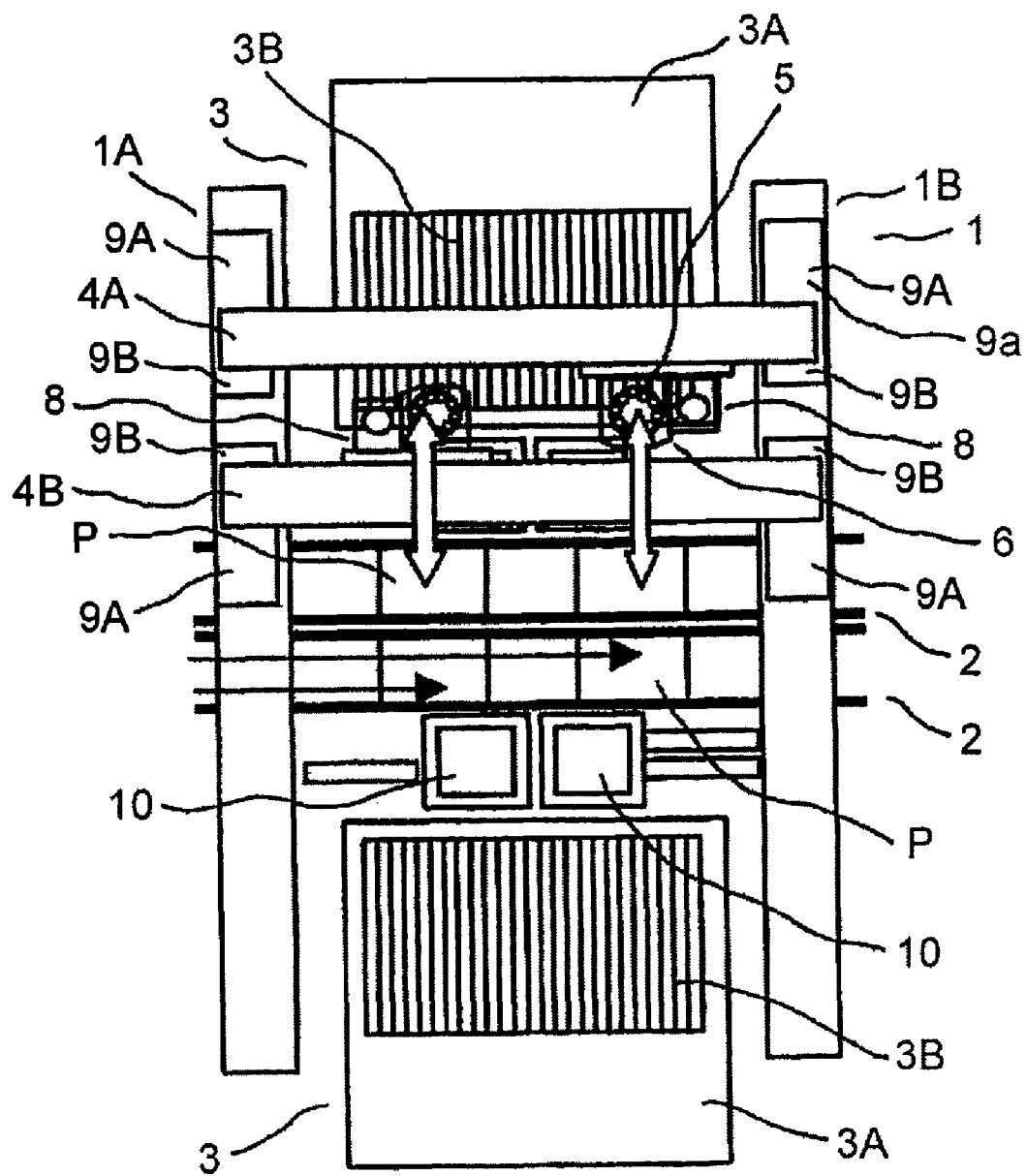
FIG. 10 is a schematic plan view for explaining an electronic component pickup operation of an electronic component mounting apparatus of a fifth embodiment of the invention.

At this time, for example, as shown in FIG. 10, when the suction nozzles 5 of the mounting heads 6 provided on the beam 4B on the front side and the beam 4A on the rear side simultaneously pick up electronic components from the component feeding device 3 on the rear side, the suction nozzles 5 of the mounting heads 6 of both the beams 4A and 4B achieve picking up electronic components from the component feeding units 3B in both the left and right half regions of the component feeding device 3 on the rear side instead of from the left or right half region limitedly, being controlled so as not to hit against each other, by moving both the beams 4A and/or 4B apart from each other and then moving both the mounting heads 6 to the opposite sides, as described above.

After picking up the electronic components, the suction nozzles 5 of the beam 4B on the front side mount the electronic components on the left printed board P on the carrying device 2 on the rear side and the suction nozzles 5 of the beam 4A on the rear side mount the electronic components on the right printed board P on the carrying device 2 on the rear side. At this time, the suction nozzles 5 of both the beams 4B and 4A may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right printed boards P on the carrying device 2 on the rear side. In both the described cases, the suction nozzles 5 of the mounting heads 6 of both the beams 4A and 4B are controlled so as not to hit against each other.

Another two printed boards P are already positioned on the positioning portions of the carrying device 2 on the front side, respectively. Therefore, after completing the mounting of the electronic components on the two printed boards P on the carrying device 2 on the rear side, the suction nozzles 5 of the beam 4B on the front side mount the electronic components on the left printed board P on the carrying device 2 on the front side and the suction nozzles 5 of the beam 4A on the rear side mount the electronic components on the right printed board P on the carrying device 2 on the front side. At this time, the suction nozzles 5 of both the beams 4A and 4B may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right printed boards P on the carrying device 2 on the front side. In both the described cases, the suction nozzles 5 of the mounting heads 6 of both the beams 4A and 4B are controlled so as not to hit against each other.

Although two printed boards P are positioned on each of the carrying devices 2 and electronic components are mounted thereon in the fifth embodiment, the invention is not limited to this. One printed board P may be positioned on each of the carrying devices 2 and electronic components may be mounted thereon.

Next, a sixth embodiment will be described referring to FIG. 11, but only a structure differing from the fifth embodiment will be described. While in the fifth embodiment the component feeding devices 3 are disposed on both the sides of the carrying device 2 respectively and two printed boards P are provided on each of the two carrying devices 2, the sixth embodiment has a tray feeder 30 and component feeding units 3B arrayed on a feeder base 3A as the component feeding devices provided on the rear side of the carrying device 2, and one printed board P is positioned on the positioning portion of the carrying device 2.

The tray feeder 30 has, for example, a magazine 30C storing plural stages of palettes 30B on which the trays 30A having numerous arrayed electronic components are mounted, a drawing mechanism drawing the predetermined palette 30B of this magazine 30C, and an elevator mechanism lifting up the palette 30B drawn by this drawing mechanism to the electronic component supply position. However, the invention is not limited to this, and any component feeding device may be used as long as it supplies electronic components with the tray 30A.

In the sixth embodiment, the Y direction linear motors and the X direction linear motors corresponding to the beams 4A and 4B respectively are controlled so that the suction nozzles 5 of the mounting heads 6 provided on the beams 4A and 4B pick up electronic components from either of the component feeding devices 3.

In detail, the suction nozzles 5 of the mounting head 6 provided on the beam 4A on the rear side pick up electronic components from the component feeding device 3 on the rear side and the suction nozzles 5 of the mounting head 6 provided on the beam 4B on the front side pick up electronic components from the component feeding device 3 on the front side. Furthermore, as shown in FIG. 11, for example, the suction nozzles 5 of the mounting head 6 provided on the beam 4A on the rear side pick up electronic components not only from the component feeding device 3 on the rear side but also from the component feeding device 3 on the front side, and similarly the suction nozzles 5 of the mounting head 6 provided on the beam 4B on the front side pick up electronic components not only from the component feeding device 3 on the front side but also from the component feeding device 3 on the rear side.

Figure 11:
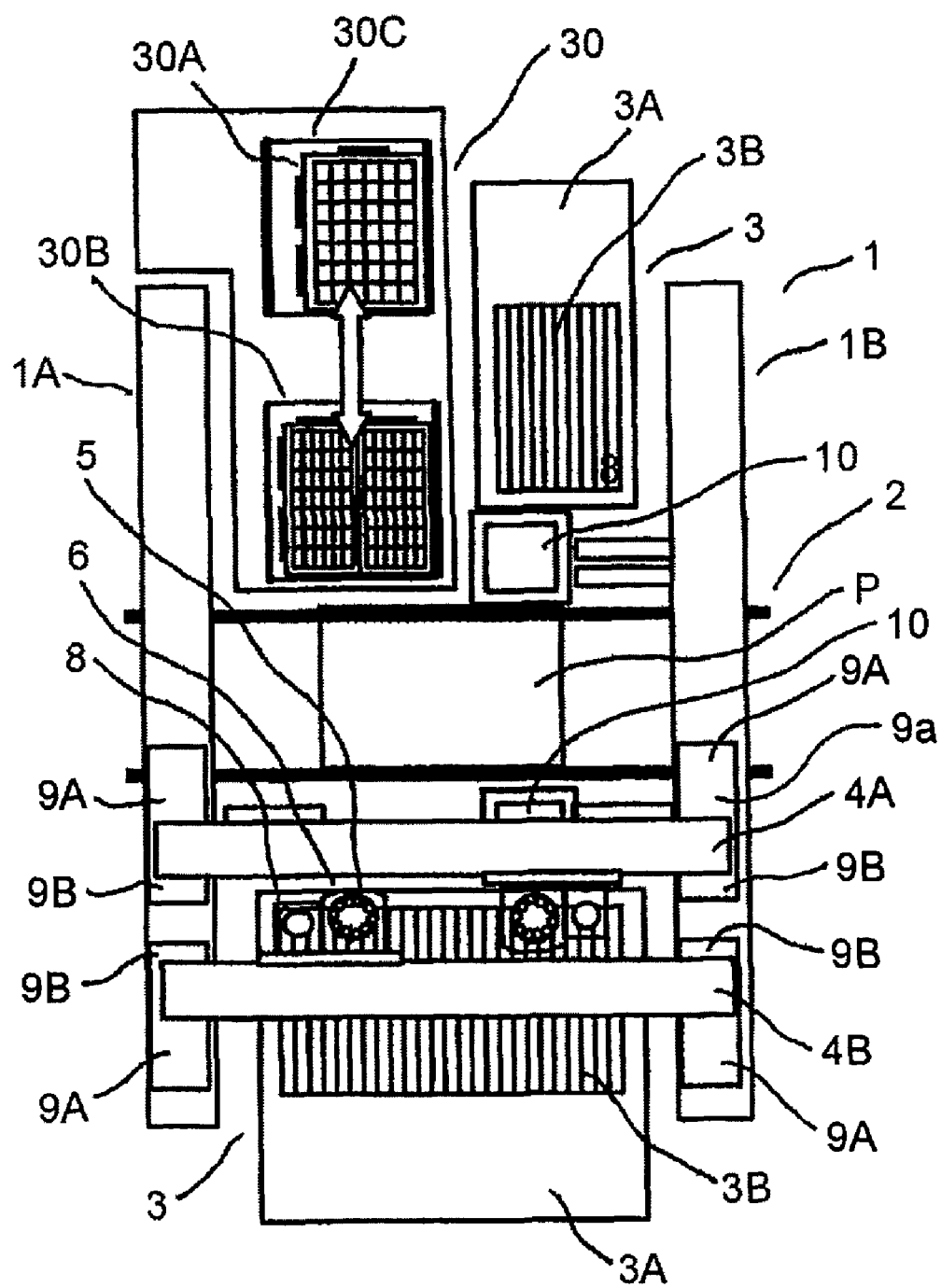
FIG. 11 is a schematic plan view for explaining an electronic component pickup operation of an electronic component mounting apparatus of a sixth embodiment of the invention.

In this case, for example, as shown in FIG. 11, when the suction nozzles 5 of the mounting heads 6 provided on the beam 4B on the front side and the beam 4A on the rear side simultaneously pick up electronic components from the component feeding device 3 on the front side, the suction nozzles 5 of the mounting heads 6 of both the beams 4A and 4B achieve picking up electronic components from the component feeding units 3B in both the left and right half regions of the component feeding device 3 on the front side instead of from the left or right half region limitedly, being controlled so as not to hit against each other, by moving both the beams 4A and/or 4B apart from each other and then moving both the mounting heads 6 to the opposite sides, as described above.

After picking up the electronic components, the suction nozzles 5 of the beam 4B on the front side mount the electronic components on the left half region of the printed board P on the carrying device 2 and the suction nozzles 5 of the beam 4A on the rear side mount the electronic components on the right half region of the printed board P on the carrying device 2. At this time, the suction nozzles 5 of both the beams 4B and 4A may perform the mounting operations simultaneously.

Furthermore, by moving both the beams 4A and/or 4B apart from each other and then moving both the mounting heads 6 to the opposite sides, the suction nozzles 5 of the beams 4A and 4B may also mount the electronic components on the opposite left and right half regions of the printed board P on the carrying device 2. In both the described cases, the suction nozzles 5 of the mounting heads 6 of both the beams 4A and 4B are controlled so as not to hit against each other.

Although one printed board P is positioned on the carrying device 2 and electronic components are mounted thereon in the sixth embodiment, the invention is not limited to this. Two printed boards P may be positioned on the carrying device 2 and electronic components may be mounted thereon, or two carrying devices 2 may be provided, one or two printed board P may be positioned on each of the devices 2 and electronic components may be mounted thereon.

When the component feeding devices 3 are provided on both the sides of the carrying device 2 respectively, particularly when the tray feeder 30 having electronic components on the tray 30A for picking up the electronic components by the suction nozzles 5 is used as one of the component feeding devices 3, conventionally the operating rate of the corresponding beam 4A on the rear side is decreased and the production efficiency is low when the frequency of picking up electronic components from this tray feeder 30 is low. In the invention, however, since the beam 4A on the rear side achieve picking up electronic components from the component feeding device 3 on the front side, as described above, the operating rates of both the beams 4A and 4B are increased and the production efficiency is enhanced.

Although the embodiments of the invention are described as above, the those skilled in the art would understand that various substitutions, changes or modifications are possible based on the above description, and the invention includes various substitutions, changes or modification within the scope of the invention.

The invention provides an electronic component mounting apparatus which increases the operating rate of the beam to enhance the production efficiency. The invention also provides an electronic component mounting apparatus which is applicable to the case in which the component feeding device is provided on one side of the carrying device as well as the case in which the component feeding device are provided on both sides of the carrying device respectively for reasons of types of electronic components or a setting space.

What is claimed is:

1. An electronic component mounting apparatus comprising:
    a carrying device carrying a printed board in a first direction and having a first side and a second side along the first direction;
    a first component feeding device supplying electronic components and disposed on the first side of the carrying device;
    a second component feeding device supplying electronic components and disposed on the second side of the carrying device;
    a first beam and a second beam that are movable in a second direction;
    a first mounting head movable along the first beam and comprising a first suction nozzle; and
    a second mounting head movable along the second beam and comprising a second suction nozzle,
    wherein the first suction nozzle is configured to pick up an electronic component from both the first component feeding device and the second component feeding device, and the second suction nozzle is configured to pick up an electronic component from both the first component feeding device and the second component feeding device.

2. The electronic component mounting apparatus of claim 1, further comprising a first elongated base and a second elongated base that are elongated in the second direction, and a moving member disposed at each end of the first beam and at each end of the second beam so as to be placed movably on a corresponding elongated base,
    wherein, in each moving member, a portion of said each moving member extending in the second direction between the two beams is shorter than a portion of said each moving member extending away from the two beams in the second direction, and the first and second mounting heads are placed between the two beams.

* * * * *